United States Patent [19]

Waldhauer et al.

[11] Patent Number: 4,868,517

[45] Date of Patent: Sep. 19, 1989

[54] VARIOLOSSER

[75] Inventors: Fred D. Waldhauer, La Honda; Carlos A. Baez, San Mateo, both of Calif.

[73] Assignee: Resound Corporation, Redwood City, Calif.

[21] Appl. No.: 287,394

[22] Filed: Dec. 20, 1988

Related U.S. Application Data

[63] Continuation-in-part of Ser. No. 159,772, Feb. 23, 1988, abandoned.

[51] Int. Cl.⁴ .......................... H03F 3/45; H03G 3/10
[52] U.S. Cl. ...................................... 330/254; 330/285
[58] Field of Search ............... 330/129, 133, 254, 257, 330/279, 285, 307

[56] References Cited

U.S. PATENT DOCUMENTS 3,727,146  4/1973  Hughes .............................. 330/254

Primary Examiner—Steven Mottola
Attorney, Agent, or Firm—McCubbrey, Bartels, Meyer & Ward

[57] ABSTRACT

An improved variable gain circuit is described having an input for an audio signal and an output for an audio signal. An operational amplifier having inverting and non-inverting inputs and an output has its input connected to the audio input. The first differential cell having inverting and non-inverting inputs, output, and a first control current terminal, has one input connected to the output of the operational amplifier and the other input connected to a reference potential. The output of the first differential cell is connected to one of the inputs of the operational amplifier in negative feedback relation and a source of controlling current is connected to the control current terminal. The second differential cell is also provided having inverting and non-inverting inputs, an output, and a second control current terminal. One input of the second differential cell is connected to the output of the operational amplifier and the other of the inputs is connected to the source of reference potential. The second control current terminal is connected to a second source of controlling current and the output of the second differential cell provides a current having a gain which is substantially the ratio of the second to the first controlling current.

17 Claims, 4 Drawing Sheets

VARIOLOSSER

FIELD OF THE INVENTION

This application is a continuation-in-part of abandoned application Ser. No. 159,772, filed Feb. 23, 1988.

This invention relates to the field of audio signal processing and specifically to an improved variable gain circuit suitable for use with audio compressors.

BACKGROUND OF THE INVENTION

Audio compressors are well known devices which are used to modify the dynamic range of an audio signal. An audio compressor may be considered as having two parts: an electronically controlled variolosser or gain adjusting device and a control system with associated circuits to generate control signals which control the gain of the device as a prescribed function of the input (or output) signal. Variolossers are also useful in other applications. For example, a variolosser may be used as a fixed gain device such as a preamplifier or filter with slight modifications.

Audio compressors are characterized in two categories. If the control signals are derived from the input signal of the compressor, the compressor is said to be of the feedforward type; if the control signals are derived from the output of the compressor, the compressor is said to be of the feedback type. The feedforward configuration requires that the dynamic range of the gain control circuitry be equal to that of the input signal. The advantage of this configuration is that the circuit is inherently stable. In a feedback configuration, a larger range of signals can be accurately processed since the gain control signal samples the output signal which has already been compressed. However, instability is often a problem with feedback compressors. In either of the above cases, a derived control voltage is used to control the loss or gain of the variable loss circuit.

Because of the trend toward miniaturization in electronics today, many audio devices are being designed to operate with single cell batteries. In the field of audio signal processing, a need exists to manufacture compressors, expanders, amplifiers, and filters which may be operated at very low voltages. Low voltage applications for these devices are numerous. However, because of the complexity of the functions provided by compressors and expanders it has previously been impossible to manufacture these circuits in a topology which functions reliably at power supply voltages as low as 1 volt and provide a continuously variable compression ratio. For an example of a low voltage compressor circuit employing the variolosser of the present invention, refer to U.S. patent application Ser. No. 159,949 invented by the present inventors and filed of even date with that of the parent to this application.

Operation at low voltage allows a compressor or expander to be powered by a single cell battery. However, operation from a single cell battery severely limits the amount of total power available to the circuitry powered therefrom. Therefore, it is also desirable to design low voltage circuitry wherein the current consumption of the circuitry is minimized.

SUMMARY OF THE INVENTION

Briefly described, the present invention contemplates an improved variable gain circuit which includes first and second differential cells having inverting and non-inverting input transistors wherein the differential cells include current mirror loads and emitter coupled transistor pairs and further wherein the input of the variable gain circuit comprises the collector of the inverting input transistor of said first differential amplifier. The base of the non-inverting input transistor of said first differential amplifier is coupled to the base of the inverting input transistor of the second differential pair and the base of the inverting input transistor of the first differential amplifier is coupled to the base of the non-inverting input transistor of the second differential amplifier. Transistor bias and feedback is generated by an operational amplifier having its inputs coupled to the input differential pair and its output coupled to the common connection of the base of the non-inverting input transistor of said first differential amplifier and the base of the inverting input transistor of the second differential pair. The present invention further includes first and second current sink means coupled to the common emitters of said first and second differential cells, respectively wherein the ratio of the currents flowing in said current sink means controls the gain of the variable gain circuit.

Accordingly, it is an object of the present invention to provide a variable gain circuit which is operable from a low voltage battery.

It is another object of the present invention to provide a variable gain circuit wherein current consumption is minimized.

It is another object of the present invention to provide a variable gain circuit which may be used to expand or compress an audio signal.

It is yet another object of the present invention to provide a continuously variable gain circuit which is easily manufactured in the form of an integrated circuit.

It is still another object of the present invention to provide a continuously variable gain circuit wherein the maximum signal handling capability is provided for the largest input signals.

BRIEF DESCRIPTION OF THE DRAWING

These and other objects may be fully appreciated through the description below and the accompanying drawing, in which.

DETAILED DESCRIPTION OF THE INVENTION

Figure 1:
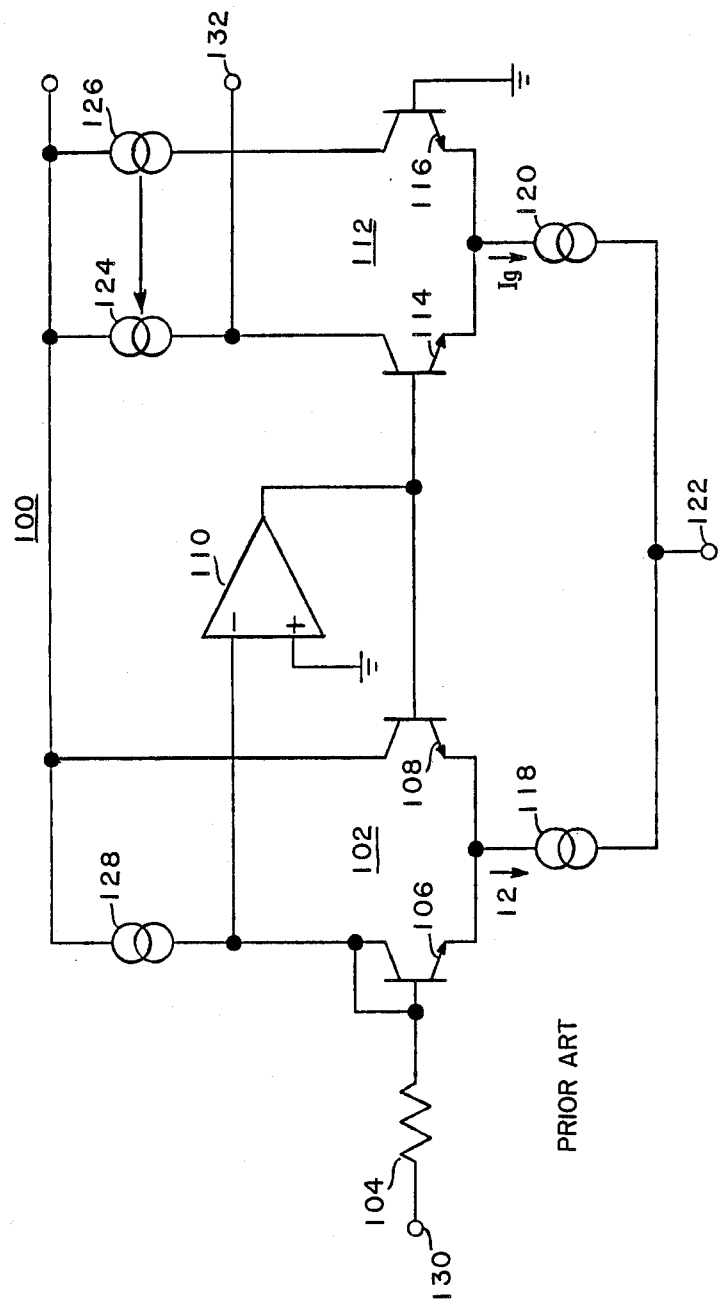
FIG. 1 is a schematic diagram of a prior art compressor adapted for use with a telephone system.

A variable gain circuit is one component of a compressor or expander wherein the gain of the circuit is varied under the control of a control circuit based on a desired relationship between the input and output signals. In the case of the present invention, the variable gain circuit or variolosser is a current multiplier whose transfer function is linear. One example of a prior art variolosser is shown in FIG. 1. This device is a Signetics NE572 and it is of the feedback type. In the circuit 100, the input signal is coupled to a differential amplifier 102 through a resistor 104. The differential amplifier 102 is comprised of transistors 106 and 108 which are coupled in a common emitter configuration. The base and collector of transistor 106 are coupled together. The base/collector connection of transistor 106 is further coupled to the input of operational amplifier 110.

The output stage of circuit 100 is comprised of differential pair 112 which is formed by transistors 114 and 116. The base terminal of transistors 108 and transistor 114 is coupled in common. This common connection is further coupled to the output of operational amplifier 110. Current sources 118 and 120 are coupled between the common emitters of differential pairs 102 and 112 and a reference terminal 122. Current sources 124 and 126 are coupled to the collectors of transistors 114 and 116, respectively. Current source 124 is a variable current source whose output current depends on the output of current source 126. A current source 128 is coupled to the collector/base connection of transistor 106.

In this type of variable gain circuit, a compressor is formed by placing the variolosser in the feedback loop of an operational amplifier and accordingly is prone to instability. Current gain in this device is controlled by varying the output current Ig in differential pair 112 relative to the fixed current I2 in differential pair 102. The circuit relies on the virtual ground between the input of operational amplifier 110 (with negative feedback) to maintain equal base-to-emitter voltages between its two emitter coupled pairs 102 and 112 and the input diode formed by transistor 106. As an increasing signal appears at the input terminal 130, the current therefrom is summed with the current generated by current source 128 at the input of operational amplifier 110 which generates a decreasing output voltage in response thereto. This decreasing voltage lowers the base voltage of transistor 114. This in turn causes current sources 124 and 126 to generate a relatively lower current at output terminal 132. In a similar fashion, a decreasing input current at terminal 130 will cause current sources 124 and 126 to generate a relatively higher current at output terminal 132. Therefore, the current consumption of circuit 100 varies as a function of input current.

In order to vary the current gain of circuit 100 from 0 dB to 20 dB, a 20 dB change in the gain control signal (Ig) is required. As a result, the power dissipation of the circuit 100 increases as a function of the gain control signal Ig. In addition, this circuit requires a relatively high voltage (e.g., 5 volts) for proper operation.

The present invention provides an improvement over the circuit 100 by varying the current in the input and output differential cells independently or in opposite directions. A 20 dB increase in current gain is achieved by redistributing the quiescent current between the input and output differential pairs such that the current through the output cell is 20 dB greater than the current through the input cell. As a result, the power dissipation may be independent of the gain set by the cell current control signals.

Figure 2:
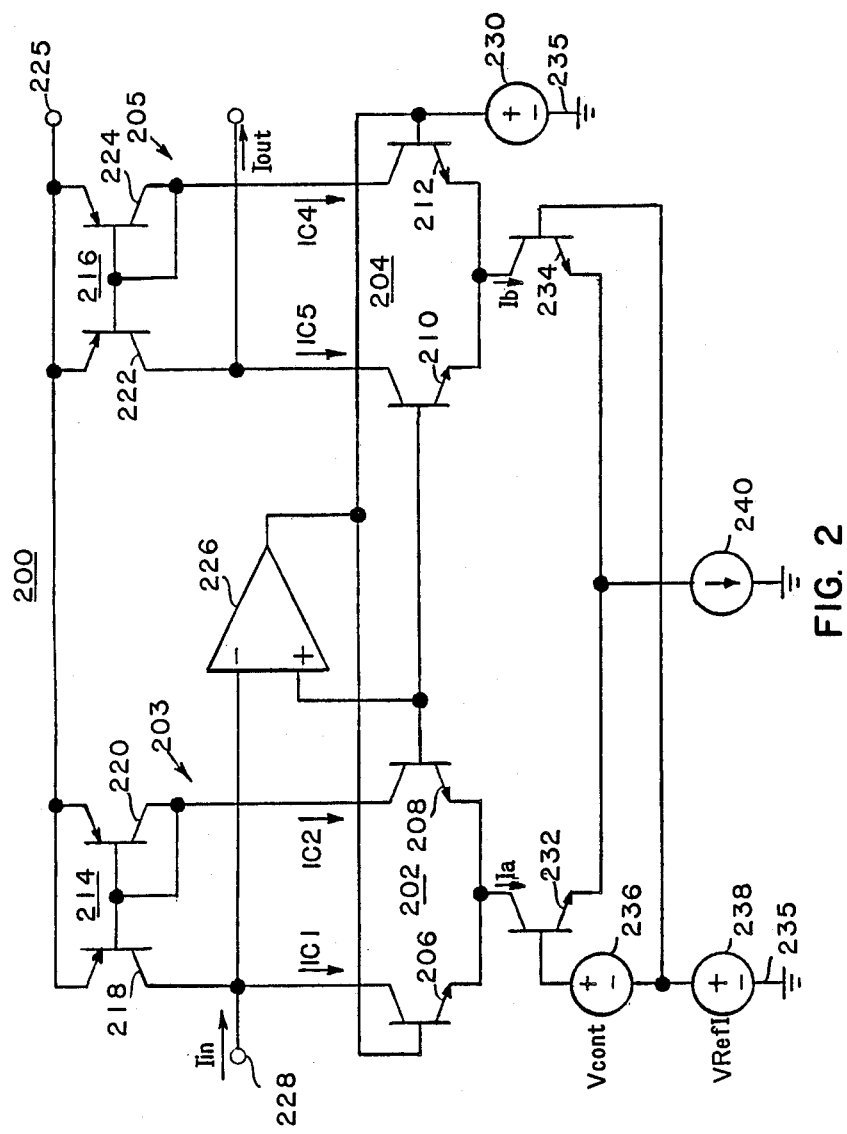
FIG. 2 is a schematic diagram of the variable gain circuit of the present invention.

Referring now to FIG. 2, the present invention includes differential cells 203 and 205 comprising differential pairs 202 and 204. Differential pair 202 is formed by transistors 206 and 208 and differential pair 204 is formed by transistors 210 and 212, respectively. Each of the differential pairs 202 and 204 are further coupled to current mirror loads 214 and 216, respectively. Current mirror 214 is formed by transistors 218 and 220 which are coupled with their bases in common. Current mirror 216 is formed by transistors 222 and 224 which are coupled with their bases in common. Transistors 220 and 224 are each disposed with their bases and collectors in common and accordingly they function as diodes and are hereinafter referred to as current mirror reference transistors. The current flow out of the collectors of transistors 220 and 224 establishes a base/emitter voltage in the current mirrors which causes a mirrored current to be generated at the collectors of transistors 218 and 222 which is controlled by the relative sizes of the devices. In other words, if for example, transistors 220 and 218 are of identical size, whatever current is generated by transistor 220 will be substantially generated by transistor 218 in a 1-1 relationship.

In the present invention, the differential cells 203 and 205 are coupled in a pairwise configuration. Specifically, the bases of transistors 208 and 210 are coupled together and the bases of transistors 206 and 212 are coupled together. Stated alternatively, the inverting input of differential cell 203 is coupled to the non-inverting input of differential cell 205 and vice versa. Operational amplifier 226 is disposed with its inverting input coupled to the common collector connection of transistors 206 and 218 and its non-inverting input coupled to the common base connection of transistors 206 and 212. The common base connection of transistors 206 and 212 is further coupled to a source of reference potential 230. The output of operational amplifier 226 is coupled to the common base connection of transistors 208 and 210. In another aspect of this invention, the base inputs of output differential cell transistors can be interchanged to provide a phase reversal from input to output.

One interesting aspect of the present invention lies in the fact that the input current at input terminal 228 is applied to the collectors of transistors 206 and 218 in parallel. Positive input currents therefore add directly to the collector current of transistor 206 (and vice versa). By virtue of the pairwise connections of the differential cells 203 and 205, equal base/emitter voltages are generated in transistors 206, 212 and 208, 210. As a result, the ratio of the collector currents in the differential pair 204 is equal to the ratio of the collector currents in differential pair 202.

Negative feedback is generated by operational amplifier 226 and is established through transistors 206 and 208 which provide a low impedance summing node for the input current as well as the proper base bias current for transistors 208 and 210. Under quiescent conditions, (Iin=0) the differential pairs 202 and 204 are balanced with IC1=IC2 and IC4=IC5 (neglecting the small base currents). As the input current increases, increased current IC1 is injected into the collector of transistor 206 and therefore the base/emitter voltage of transistor 206 increases while IC2 and the base/emitter voltage of transistor 208 decreases. Similarly, IC5 and the base/emitter voltage of transistor 210 decreases while IC4 and the base/emitter voltage of transistor 212 increases, thus producing an output current.

In yet another aspect of the present invention, the input signal may be applied to the collectors of transistors 208 and 220. In this case, in order to maintain the negative feedback relation, operational amplifier 226 is disposed with its non-inverting input coupled to the common collector connection of transistors 208 and 220 and its inverting input coupled to the common base connection of transistors 206 and 212.

The ratio of the output current to the input current, the current gain, is determined by the ratio of the total amount of current steered out of the common emitter connections of the differential cells 202 and 204. In other words, the current gain of the variolosser 200 is determined by the ratio of the quiescent collector currents Ia and Ib of transistors 232 and 234 which are coupled to the respective common emitter connections of differential pairs 202 and 204.

The quiescent collector currents of transistors 232 and 234 are controlled by their respective base voltages. Assuming the transistor at the input and output cells are the same size, if Ia is equal to Ib, the gain of circuit 200 is unity. If Ia is smaller than Ib, the gain is greater than unity and vice versa. The respective base voltages of transistors 232 and 234 may be controlled voltage sources 236 and 238. In some applications, voltage source 238 may produce a fixed reference voltage. Voltage source 236 may be a variable voltage source which produces a control voltage (Vcont). Therefore, the relative base voltages of transistors 232 and 234 and the respective currents Ia and Ib may be controlled by Vcont. This control voltage may be derived from a rectifier/filter combination (not shown) coupled to the input signal of circuit 200. It can be positive or negative simply by the choice of rectifier output polarity, thus providing both compression and expansion functions. If Vcont is positive, the circuit 200 functions as a compressor. If Vcont is negative, circuit 200 functions as an expander. Thus, the circuit 200 provides both compression and expansion by merely changing the rectifier polarity. Of course, the variolosser 200 may be operated as a fixed gain device by maintaining Vcont at a constant level.

The variolosser 200 provides a large range of current gain which may be in the range of 80dB under the control of a small linear dc voltage which may be in the range of −120mV to +120mV. The sensitivity of circuit 200 may therefore be in the range of 0.334dB/mV. This is achieved by using the control voltage to control the base/emitter voltages of current sink transistors 232 and 234, thereby taking advantage of the exponential relationship between the collector current and the base-emitter voltage of a transistor in the active region.

In the circuit 100, the variolosser relies on the virtual ground between the inputs of operational amplifier 110 (with negative feedback) to maintain equal base/emitter voltages between its two differential amplifiers and has its input applied to a diode. In contrast, the present invention maintains equal base/emitter voltages by direct connection and utilizes feedback around operational amplifier 226 to establish appropriate base current bias. Since the input signal of the circuit 200 is applied to a current mirror that is identical to the output current mirror, by virtue of the pairwise connection of differential cells 203 and 205, current consumption may be held constant regardless of the input signal level.

In another aspect of the present invention, gain reduction occurs as the magnitude of the input signal increases. As mentioned above, the circuit 200 achieves gain reduction by steering more current into its input stage than its output stage. As a result of this action, and the action of the input current mirror, the variolosser exhibits maximum signal handling ability for the largest input signals (minimum gain), since the input signal enters the cell at the point where the largest current is available. The present invention provides a variolosser structure which may be operated successfully at very voltages even with the small transistors used in small integrated circuits. As a result of its low voltage operation, this circuit is well suited for hearing aids and other low voltage applications.

Figure 2A:
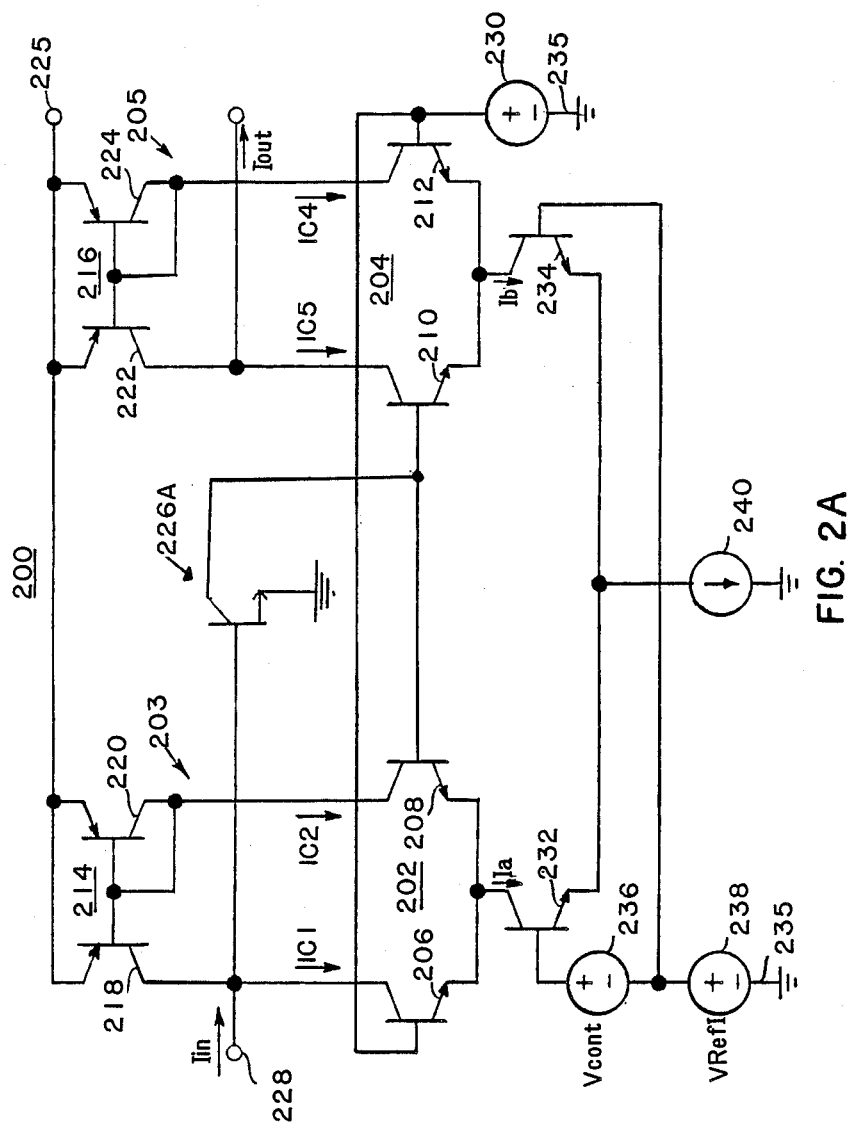
FIG. 2A is a schematic diagram of an alternative embodiment of the variable gain circuit of the present invention.

Under some circumstances, the variolosser of the invention may successfully incorporate other suitable amplifier means instead of an operational amplifier such as is shown in FIG. 2. FIG. 2A illustrates one such alternative embodiment wherein a single MPN transistor 226A is employed as the amplifier means instead of the operational amplifier 226 of FIG. 2. The emitter of the transistor 226A is connected to ground. The base of the transistor serves as the input, being connected to the terminal 228. The collector of the transistor 226A is connected to the junction between the basis of the differential pair transistors 208 and 210. It will be apparent to those skilled in the art that control over the gain of the transistor 226A determines the gain of the variolosser and this control is effected in the same way as described in connection with the operational amplifier of FIG. 2. Other forms of amplifying devices which could be used in a similar fashion will be apparent to those skilled in the art.

Figure 3:
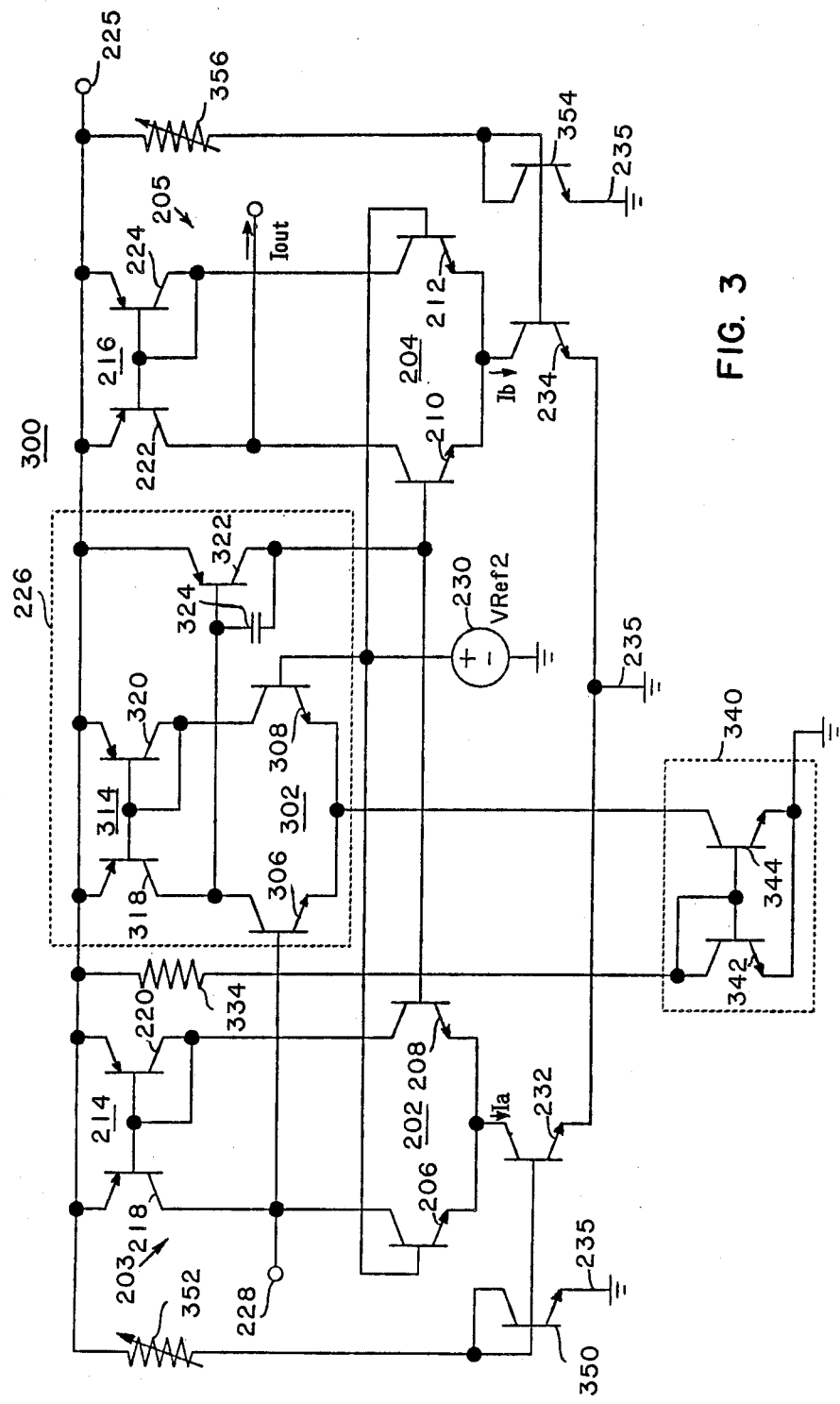
FIG. 3 is a detailed schematic diagram of the circuit of FIG. 2 disposed in a controllable gain configuration.
Figure 2:
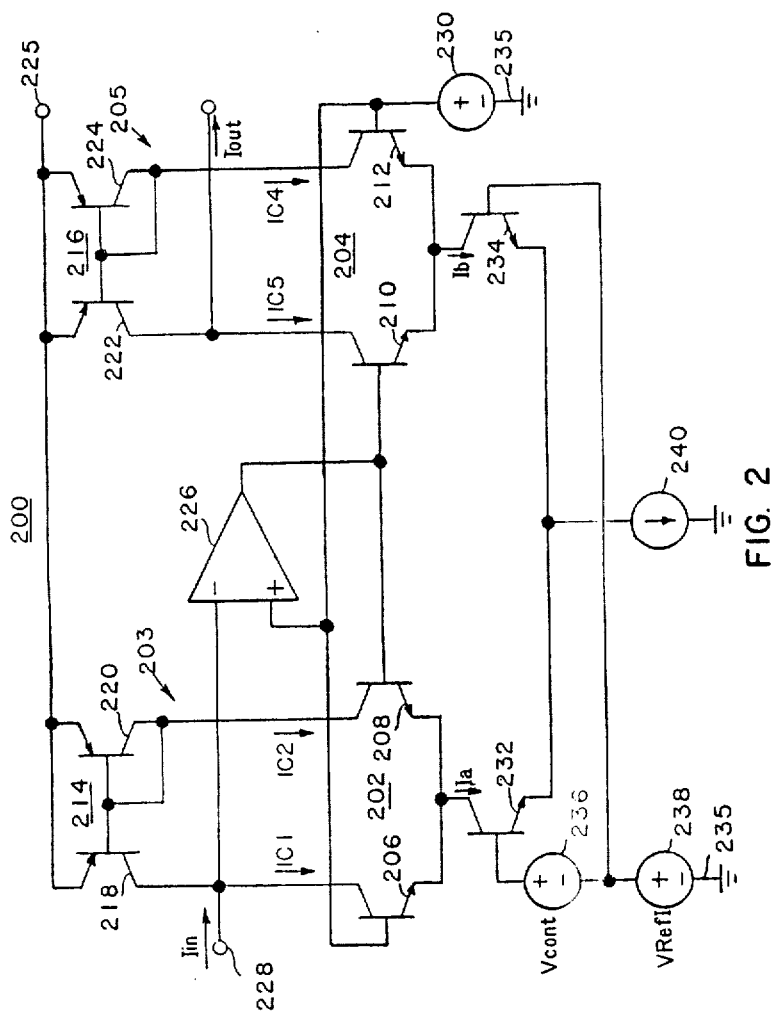

Referring now to FIG. 3, there is shown a more detailed schematic of the circuit of FIG. 2 which features improved low voltage performance. In the embodiment shown in FIG. 3, the variolosser is implemented as an adjustable gain circuit. For the sake of clarity, components which provide identical functions as the components of FIG. 2 bear identical designations. As above, the circuit 300 includes differential amplifiers 202 and 204 which are coupled to current mirror loads 214 and 216, respectively. The pairwise connection of the differential cells 203 and 205 is identical to the connections described in conjunction with FIG. 2. The operational amplifier 226 is disposed with its inverting input coupled to the common collector connection of transistors 218 and 206 and its non-inverting input is coupled to the common base connection of transistors 206 and 212 and to the source of reference potential 230.

The operational amplifier 226 is formed by a differential pair 302 comprising transistors 306 and 308. These transistors are coupled to a current mirror load 314 formed by transistors 318 and 320 which are disposed with their bases coupled together. The base and collector of transistor 320 are coupled together, thereby forming the diode portion or reference transistor of the current mirror 314. A PNP transistor 322 forms the output stage of operational amplifier 226. The base of PNP transistor 322 is coupled to the common collector connection of transistors 306 and 318. The emitter of PNP transistor 322 is coupled to the power supply input terminal 225 and its collector is coupled to the common base connection of transistors 208 and 210. The configuration of the operational amplifier 226 is well known and its operation will be understood by a person of ordinary skill in the art. Its function in the circuit 300 is identical to the functional operation of operational amplifier 226 described in conjunction with FIG. 2.

Reference currents for operational amplifier are provided by the reference current generator 340, which includes NPN transistors 342 and 344 coupled in a current mirror configuration. Each of these transistors are coupled with their emitters coupled to ground terminal 235. The collector of transistor 344 is coupled to the emitter connection of transistors 306 and 308, thereby forming the current sink for differential pair 302. The current sinking capability of reference current generator is controlled by transistor 342, disposed with its collector and base coupled together, and resistor 334.

Since transistor 342 is clamped to ground, a fixed voltage drop will be developed across resistor 334 causing a fixed current to flow through resistor 334 into transistor 342 which will be mirrored in transistor 344, thus establishing the current consumption of operational amplifier 226.

As above, the gain of the circuit 300 is set by the ratio of currents Ia and Ib flowing into the collectors of transistors 232 and 234, respectively. These currents may be controlled in a number of ways. In one embodiment, the bases of transistors 232 and 234 could be coupled to the common base connections of the reference current generator 340 and the relative currents flowing in transistors 232 and 234 could be set by controlling the relative areas of the respective devices. In the embodiment shown, transistors 232 and 234 are coupled in current mirror configurations with the addition of transistors 350 and 354, respectively. Transistors 350 and 354 are disposed with their emitters coupled to ground terminal 235 and their collectors and bases coupled in common wherein this common connection is further coupled to the bases of transistors 232 and 234, respectively. Variable resistors 352 and 356 may be coupled between the power supply input terminal 336 and the respective common base/collector connections of transistors 350 and 354 so that the ratio of the settings of variable resistors 352 and 356 controls the gain of circuit 300. As mentioned above, the bias voltage for transistors 232 and 234 may also be generated by a control voltage generator to provide compression and expansion functions.

The low voltage operation aspect of this invention can be appreciated by reference to FIG. 3. The circuit 300 is operable from voltages as low as or lower than 1.1 volts. As a result of this low voltage operation, it is well suited for applications such as hearing aids or portable radios. The minimum operating supply voltage for the circuit 300 is determined by the total number of series voltage drops necessary to keep all of the transistors of the circuit in their proper region of operation. FIG. 3 shows that the circuit 300 has three critical series voltage drops: the base/emitter voltage of transistor 220, the collector/emitter voltage of transistor 208 and the collector/emitter of voltage of transistor 232. At low bias currents, transistors with appropriately small dimensions for integrated circuits useful in in-the-ear hearing aids will have a base/emitter voltage in the range of 0.65 volts and a collector/emitter voltage in the range of 0.15 volts. Therefore, even with these small dimensions, the circuit 300 can be operated from voltages as low as 0.95 volts.

In summary, a low voltage variable gain circuit has been described. The present invention includes a two stage differential amplifier structure coupled in a pairwise configuration. The feedback and bias level of the circuit is controlled by an operational amplifier coupled to the input differential amplifier. As the gain of the variolosser is varied, current is diverted between the input and output stages so that the total current consumed by the circuit may be held constant regardless of the gain of the device. The unique topology of the present invention allows reliable circuit operation from a low voltage power source. Accordingly, other uses and modifications will be obvious to a person of ordinary skill in the art and all of such modifications are intended to be within the scope of the present invention.

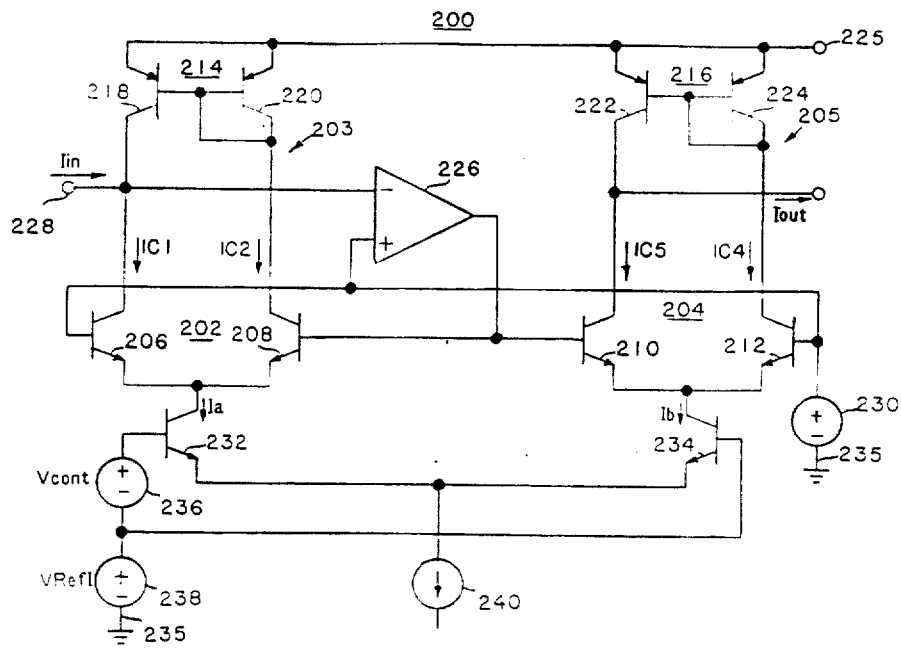

What is claimed is:

1. An improved variable gain circuit comprising:
   input means for inputting an audio input signal;
   output means for outputting an audio output signal;
   amplifier means having an input and an output;
   a source of reference potential;
   first and second sources of controlling currents;
   a first differential cell having inverting and inputs, an output and a first control current terminal, wherein one input of said first differential cell is connected to said output of said amplifier means, and the other of said inputs is connected to said source of reference potential, and said output of said first differential cell is connected to said input of said amplifier means in negative feedback relation, and further wherein said first control current terminal is connected to said first source of controlling current; and
   a second differential cell having inverting and non-inverting inputs, an output and a second control current terminal, wherein one input of said second differential cell is connected to said output of said amplifier means and the other of said inputs is connected to said source of reference potential, said output of said second differential cell connected to said output means, and said second control current terminal connected to said second source of controlling current, wherein the current gain of said variable gain circuit is substantially the ratio of said second to said first controlling current.

2. The apparatus of claim 1 wherein said amplifier means comprise a transistor.

3. The apparatus of claim 1 wherein said amplifier means comprise an operational amplifier.

4. An improved variable gain circuit comprising:
   input means for inputting an audio signal;
   reference potential means for generating a reference voltage;
   amplifier means having a first input coupled to said input means and a second input coupled to said reference potential means and an output;
   input differential cell means having inverting and non-inverting inputs, a current control terminal and an output for providing an output current which is proportional to current flowing in said inverting and non-inverting inputs wherein the non-inverting input of said differential cell is coupled to the output of said amplifier means, the inverting input of said input differential cell means is coupled to said reference potential means and the output of said input differential cell means is coupled to said first input of said amplifier means; and
   output differential cell means having first and second inputs, a current control terminal and an output for providing an output current which is proportional to current flowing in said first and second inputs wherein said first input of said output differential cell means is coupled to the non-inverting input of said input differential cell and said second input of said output differential cell means is coupled to said reference potential means wherein the ratio of currents flowing in said current control terminals of said input and output differential cell means controls the gain of said variable gain circuit.

5. The apparatus of claim 4 wherein said amplifier means comprise a transistor.

6. The apparatus of claim 4 wherein said amplifier means comprise an operational amplifier.

7. The apparatus of claim 1 wherein said improved variable circuit may be operated at voltages as low as 0.95 volts.

8. The apparatus of claim 1 wherein said improved variable circuit is adapted for implementation on an integrated circuit.

9. The apparatus of claim 1 wherein said first differential cell means comprises first and second NPN emitter coupled transistors coupled to a current mirror comprising first and second PNP transistors, each of said transistors having a base, an emitter and a collector wherein the collectors of said first NPN and PNP transistors are coupled together and the collectors of said second NPN and PNP transistors are coupled together and further wherein the base and collector of said second PNP transistor are coupled together and the bases of said first and second PNP transistors are coupled together, wherein the base of said first NPN transistor comprises the inverting input of said differential cell and the base of said second NPN transistor comprises the non-inverting input of said differential cell and the collector connection of said first PNP and NPN transistors comprises the output of said first differential cell wherein the emitter connection of said first and second NPN transistors is coupled to said first control current terminal.

10. The apparatus of claim 1 wherein each of said differential cell means comprises first and second emitter coupled transistors coupled to a current mirror comprising first and second current mirror transistors of opposite polarity to the polarity of said first and second emitter coupled transistors, each of said transistor having a base, an emitter, and a collector, wherein the emitters of said first and second current mirror transistors are coupled to a voltage source, wherein the collectors of said first transistors are coupled together and the collectors of said second transistors are coupled together and further wherein the base and collector of said second current mirror transistor are coupled together and the bases of said first and second current mirror transistors are coupled together, wherein the base of said first emitter coupled transistor comprises the inverting input of said differential cell means and the base of said second emitter coupled transistor comprises the non-inverting input of said differential cell means and the collector connection of said first transistors comprises the output of said differential cell means wherein the emitter connection of said first and second emitter coupled transistors is coupled to one of said control current terminals.

11. An improved variable gain circuit comprising:
input means for inputting an audio signal;
reference potential means for generating a reference voltage;
operational amplifier having inverting and non-inverting inputs and an output wherein the inverting input of said operational amplifier is coupled to said input means and said non-inverting input is coupled to said reference potential means;
input differential cell having inverting and non-inverting inputs, a current control terminal and an output wherein the non-inverting input of said input differential cell is coupled to the output of said operational amplifier, the inverting input of said input differential cell is coupled to said reference potential means and the output of said input differential cell means is coupled the inverting input of said operational amplifier; and
output differential cell having first and second inputs, a current control terminal and an output constituting the output of said variable gain circuit, wherein said first input of said output differential cell means is coupled to the output of said operational amplifier and said second input to said output differential cell is coupled to said reference potential means wherein the ratio of currents flowing in said first and second control current terminals of said input and output differential cells controls the gain of said variable gain circuit.

12. The apparatus of claim 11 wherein the signal at the output of said variable gain circuit is 180× phase shifted with respect to the signal at said input terminal.

13. The apparatus of claim 11 wherein the signal at the output of said variable gain circuit is in phase with respect to the signal at said input terminal.

14. The apparatus of claim 11 wherein said improved variable circuit may be operated at voltages as low as 0.95 volts.

15. The apparatus of claim 11 wherein each of said differential cell means comprises first and second emitter coupled transistors coupled to a current mirror comprising first and second current mirror transistors of opposite polarity to the polarity of said first and second emitter coupled transistors, wherein the emitters of said first and second current mirror transistors are coupled to a voltage source, wherein the collectors of said first transistors are connected together and the collectors of said second transistors are coupled together and further wherein the base and collector of said second current mirror transistor are coupled together and the bases of said first and second current mirror transistors are coupled together, wherein the base of said first emitter coupled transistor comprises the inverting input of said differential cell means and the base of said second emitter coupled transistor comprises the non-inverting input of said differential cell means and the collector connection of said first transistors comprises the output of said differential cell means wherein the emitter connection of said first and second emitter coupled transistors is coupled to one of said control current terminals.

16. An improved variable gain circuit comprising:
input means for inputting an audio signal;
reference potential means for generating a reference voltage;
operational amplifier having inverting and non-inverting inputs and an output wherein the inverting input of said operational amplifier is coupled to said input means and said non-inverting input is coupled to said reference potential means;
input differential cell having inverting and non-inverting inputs and an output wherein the non-inverting input of said differential cell is coupled to the output of said operational amplifier, the inverting input of said input differential cell means is coupled to said reference potential means and the output of said input differential cell means is coupled to the inverting input of said operational amplifier; and
output differential cell having first and second inputs and an output wherein one input of said output differential cell means is coupled to the non-inverting input of said operational amplifier and the other input of said output differential cell means is coupled to said reference potential means wherein the ratio of currents flowing in input and output differential cell means controls the gain of said variable gain circuit.

17. An improved variable gain circuit comprising:

input means for inputting an audio signal;

reference potential means for generating a reference voltage;

operational amplifier having inverting and non-inverting inputs and an output wherein the inverting input of said operational amplifier is coupled to said input means and said non-inverting input is coupled to said reference potential means;

input differential cell means coupled to said input means and said operational amplifier means, said input differential cell having first and second input devices and a current control terminal wherein said first input device is coupled to the inverting input of said operational amplifier means for generating an operational amplifier output signal which is non-linearly related to said input audio signal wherein said first input device is coupled to said reference potential means and further wherein said operational amplifier output signal is developed across said second input device; and output differential cell means having first and second inputs, a current control terminal and an output for providing an output current which is proportional to current flowing in said current control terminal and which is non-linearly related to the signal on said first and second inputs wherein said first input of said output differential cell means is coupled to said operational amplifier output and said second input of said output differential cell means is coupled to said reference potential means wherein the ratio of currents flowing in said current control terminals of said input and output differential cell means controls the gain of said variable gain circuit.

* * * * *

UNITED STATES PATENT AND TRADEMARK OFFICE
CERTIFICATE OF CORRECTION

PATENT NO. : 4,868,517                Page 1 of 3

DATED      : September 19, 1989

INVENTOR(S): Fred D. Waldhauer

It is certified that error appears in the above-identified patent and that said Letters Patent is hereby corrected as shown below:

Column 8, line 6, after "and" insert --non-inverting--.

In FIGURE 2 and on the title page, the output of the amplifier 226 should be connected to the bases of the transistors 210 and not to the bases of the transistors 206 and 212. Also, the positive input of the amplifier 226 should be connected to the bases of the transistors 206 and 212, and not to the bases of the transistors 208 and 210. A copy of corrected FIGURE 2 is supplied herewith.

Signed and Sealed this

Third Day of December, 1991

Attest:

HARRY F. MANBECK, JR.

*Attesting Officer*     *Commissioner of Patents and Trademarks*

United States Patent [19]

Waldhauer et al.

[11] Patent Number: 4,868,517

[45] Date of Patent: Sep. 19, 1989

[54] VARIOLOSSER

[75] Inventors: Fred D. Waldhauer, La Honda; Carlos A. Baez, San Mateo, both of Calif.

[73] Assignee: Resound Corporation, Redwood City, Calif.

[21] Appl. No.: 287,394

[22] Filed: Dec. 20, 1988

Related U.S. Application Data

[63] Continuation-in-part of Ser. No. 159,772, Feb. 23, 1988, abandoned.

[51] Int. Cl.⁴ .......................... H03F 3/45; H03G 3/10
[52] U.S. Cl. ................................. 330/254; 330/285
[58] Field of Search ............... 330/129, 133, 254, 257, 330/279, 285, 307

[56] References Cited

U.S. PATENT DOCUMENTS 3,727,146  4/1973  Hughes .......................... 330/254

Primary Examiner—Steven Mottola
Attorney, Agent, or Firm—McCubbrey, Bartels, Meyer & Ward

[57] ABSTRACT

An improved variable gain circuit is described having an input for an audio signal and an output for an audio signal. An operational amplifier having inverting and non-inverting inputs and an output has its input connected to the audio input. The first differential cell having inverting and non-inverting inputs, output, and a first control current terminal, has one input connected to the output of the operational amplifier and the other input connected to a reference potential. The output of the first differential cell is connected to one of the inputs of the operational amplifier in negative feedback relation and a source of controlling current is connected to the control current terminal. The second differential cell is also provided having inverting and non-inverting inputs, an output, and a second control current terminal. One input of the second differential cell is connected to the output of the operational amplifier and the other of the inputs is connected to the source of reference potential. The second control current terminal is connected to a second source of controlling current and the output of the second differential cell provides a current having a gain which is substantially the ratio of the second to the first controlling current.

17 Claims, 4 Drawing Sheets